(12) United States Patent
Sawada et al.

(10) Patent No.: US 9,013,156 B2
(45) Date of Patent: Apr. 21, 2015

(54) SIGNAL GENERATION DEVICE AND SIGNAL GENERATION METHOD

(71) Applicant: Tanashin Denki Co., Ltd., Tokyo (JP)

(72) Inventors: Masakatsu Sawada, Tokyo (JP); Kenya Matsushita, Tokyo (JP)

(73) Assignee: Tanashin Denki Co., Ltd., Tokyo (JP)

( * ) Notice: Subject to any disclaimer, the term of this patent is extended or adjusted under 35 U.S.C. 154(b) by 0 days.

(21) Appl. No.: 13/901,705

(22) Filed: May 24, 2013

(65) Prior Publication Data

US 2015/0054475 A1    Feb. 26, 2015

(30) Foreign Application Priority Data

May 28, 2012  (JP) .................. 2012-121421

(51) Int. Cl.
    *G05F 1/32*      (2006.01)
    *G01R 21/127*    (2006.01)
    *H03K 17/13*     (2006.01)
    *G01R 21/133*    (2006.01)
    *G01R 31/02*     (2006.01)

(52) U.S. Cl.
    CPC .............. *G01R 21/127* (2013.01); *H03K 17/13* (2013.01); *G01R 21/133* (2013.01); *G01R 31/02* (2013.01)

(58) Field of Classification Search
    CPC ........................................................ G05F 1/32

USPC .......... 323/212, 215, 217, 235, 319; 324/691, 324/705, 713
See application file for complete search history.

(56) References Cited

U.S. PATENT DOCUMENTS

| 7,437,235 B2* | 10/2008 | Carrado, Jr. .................. 701/105 |
| 2012/0025840 A1* | 2/2012 | Kim et al. ..................... 324/509 |
| 2013/0158902 A1* | 6/2013 | Kim ............................... 702/58 |

FOREIGN PATENT DOCUMENTS

| JP | 9-15879 A | 1/1997 |
| JP | 2012-154855 A | 8/2012 |
| WO | 2009/002120 A2 | 12/2008 |

* cited by examiner

*Primary Examiner* — Matthew Nguyen
(74) *Attorney, Agent, or Firm* — Allen, Dyer, Doppelt, Milbrath & Gilchrist, P.A.

(57) ABSTRACT

A signal generation device and a signal generation method may measure leakage currents, such as an input current value I and phase-shifted current values I cos θ and I sin θ in a short period of time and automatically output the detected values without calculating a vector of a phase difference. The signal generation device generates logical signals from a voltage waveform and a current waveform of a measured power line through first and second comparators, sets parameters, full-wave rectifies the current waveform, and performs quantization transform on the full-wave rectified current waveform using a successive ΔΣADC.

4 Claims, 13 Drawing Sheets

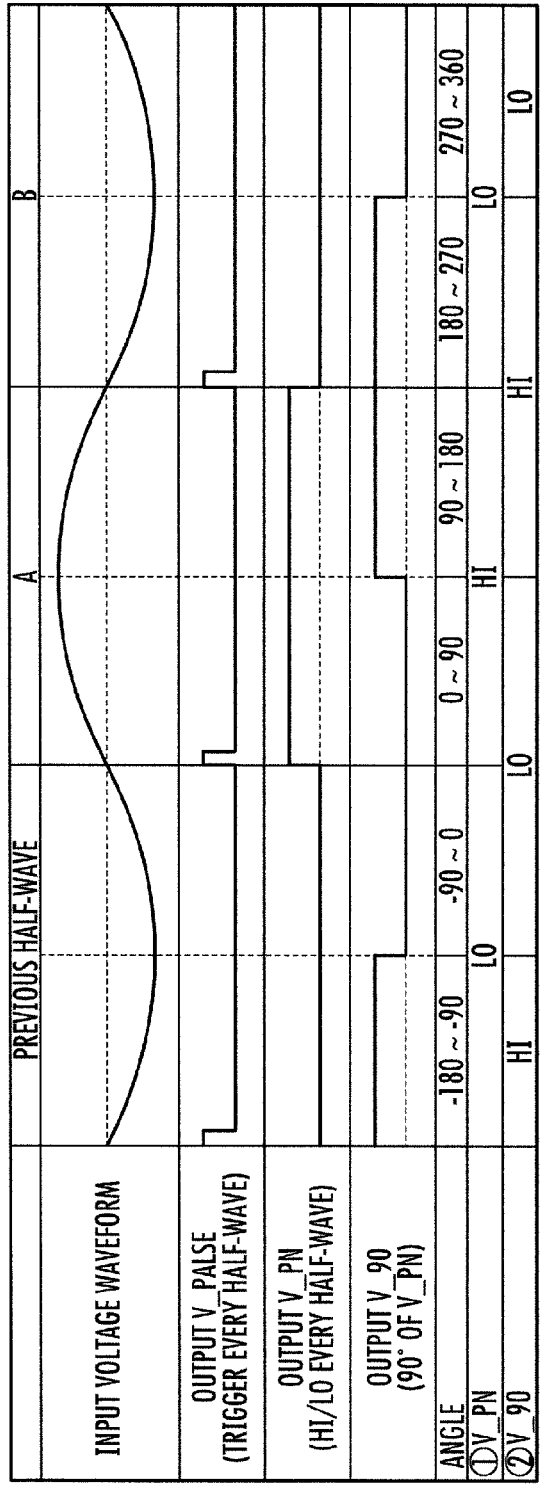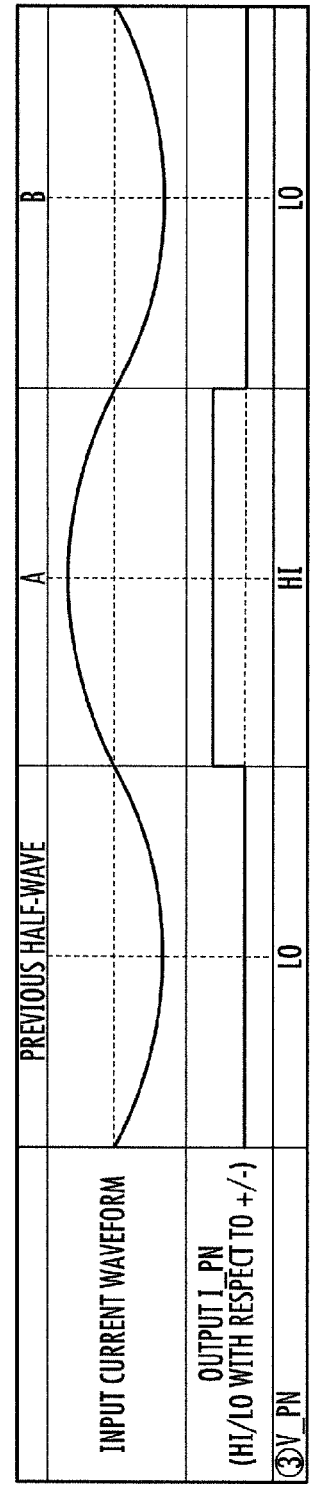
FIG. 3A
FIG. 3B

| ANGLE (REFERENCE VOLTAGE) | 0 ~ 90 | | 90 ~ 180 | | 180 ~ 270 | | 270 ~ 360 | |
|---|---|---|---|---|---|---|---|---|
| ① V_PN | + | + | + | + | − | − | − | − |
| ② V_90 | − | − | + | + | + | + | − | − |
| ③ I_PN | + | − | + | − | + | − | + | − |
| I<br>METHOD OF COUNTING (INPUT CURRENT, TOTAL LEAKAGE CURRENT OR THE LIKE) - ALWAYS SET TO UP | UP | UP | UP | UP | UP | UP | UP | UP |
| Icosθ<br>METHOD OF COUNTING (ACTIVE CURRENT, SINGLE PHASE RESISTIVE COMPONENT LEAKAGE CURRENT OR THE LIKE)<br>- SIGNAL SET TO DOWN IS OUTPUT WHEN ① AND ③ HAVE DIFFERENT SYMBOLS | UP | DW | UP | DW | DW | UP | DW | UP |
| Isinθ<br>METHOD OF COUNTING (REACTIVE CURRENT, SINGLE PHASE CAPACITIVE COMPONENT LEAKAGE CURRENT, THREE PHASE Δ-CONNECTION RESISTIVE COMPONENT LEAKAGE CURRENT OR THE LIKE)<br>- SIGNAL SET TO DOWN IS OUTPUT WHEN ② AND ③ HAVE DIFFERENT SYMBOLS | DW | UP | UP | DW | UP | DW | DW | UP |

FIG. 4

| ANGLE (REFERENCE VOLTAGE) | 0 ~ 90 | | 90 ~ 180 | | 180 ~ 270 | | 270 ~ 360 | |
|---|---|---|---|---|---|---|---|---|
| ① V_PN | + | | + | | − | | − | |
| ② V_90 | − | | + | | + | | − | |
| ③ I_PN | − | + | + | − | + | − | + | − |
| I METHOD OF COUNTING (INPUT CURRENT, TOTAL LEAKAGE CURRENT OR THE LIKE) - UP BETWEEN 0° AND 180°, DOWN BETWEEN 180° AND 360° SIGNAL SET TO INVERSION IS OUTPUT WHEN ① AND ③ HAVE DIFFERENT SYMBOLS | UP (INVERSION) | UP | UP | UP (INVERSION) | DW | DW (INVERSION) | DW (INVERSION) | DW |
| Icosθ METHOD OF COUNTING (ACTIVE CURRENT, SINGLE PHASE RESISTIVE COMPONENT LEAKAGE CURRENT, THREE PHASE Δ-CONNECTION RESISTIVE COMPONENT LEAKAGE CURRENT OR THE LIKE) - SIGNAL SET TO UP IS OUTPUT WHEN THE ANGLE IS BETWEEN 0° AND 180°, AND SIGNAL SET TO DOWN IS OUTPUT WHEN THE ANGLE IS BETWEEN 180° AND 360° | UP | UP | UP | UP | DW | DW | DW | DW |
| Isinθ METHOD OF COUNTING (REACTIVE CURRENT, SINGLE PHASE CAPACITIVE COMPONENT LEAKAGE CURRENT, THREE PHASE Δ-CONNECTION RESISTIVE COMPONENT LEAKAGE CURRENT OR THE LIKE) - SIGNAL SET TO DOWN IS OUTPUT WHEN THE ANGLE IS BETWEEN 0° AND 90°, AND 270° AND 360°, AND SIGNAL SET TO UP IS OUTPUT WHEN THE ANGLE IS BETWEEN 90° AND 270° | DW | DW | UP | UP | UP | UP | DW | DW |

FIG. 9

SIGNAL GENERATION DEVICE AND SIGNAL GENERATION METHOD

RELATED APPLICATIONS

This application is based upon prior filed copending Japanese application No. 2012-121421 filed May 28, 2012, the entire subject matter of which is incorporated herein by reference in its entirety.

FIELD OF THE INVENTION

The present invention relates to a signal generation device and a signal generation method.

BACKGROUND OF THE INVENTION

Recently, the request of a highly advanced information society for preventing a blackout is accomplished by a leakage current measurement method which can measure current leakage without blocking a device, in a method of measuring current leakage using an insulation resistance tester in which insulation failure management of a power line or a device accompanies a blackout.

A product which measures AC current and phase difference of a device using the leakage current measurement method includes, for example, a leakage current monitoring device, a leakage current measurement device, a leakage current detection device (circuit breaker) and the like. In addition, a meter which measures AC current of a device includes a power meter, a current meter and the like. These devices or meters perform detection or measurement described below.

Detection or measurement performed using a device or a meter includes measurement of AC current values, and an input current I[A], an active current Ir=I cos θ[A] and a reactive current IL−IC=I sin θ[A] are obtained through the measurement. Other than the AC current values, AC powers are measured, and an apparent power S=VI[VA], an active power P=VI cos θ[W] and a reactive power Q=VI sin θ[Var] are obtained by multiplying a voltage measurement value after measuring the AC current values. In addition, leakage currents are measured, and a total leakage current I0[A], a single phase resistive component leakage current Igr(I0r)=I0 cos θ[A], a single phase capacitive component leakage current Igc(I0c)=I0 sin θ[A], and a three phase Δ-connection resistive component leakage current Igr(I0r)=I0 sin θ/cos 30° [A] are obtained through the measurement.

As is understood from the result of the detection or measurement described above, a leakage current is obtained by multiplying a measured current value I(I0) by a measured phase difference of sin θ or cos θ or by additionally multiplying the obtained leakage current by a voltage measurement value or a coefficient.

In addition, a small-sized, speedy and stable circuit is needed in a circuit breaker in order to measure and monitor the resistive component leakage current. A product of a general circuit breaker is small-sized, and a further smaller circuit is required to be mounted inside the product.

A method of measuring a current value I0 and a phase angle and calculating a leakage current using a microcomputer or a method of obtaining a result by integrating a current value without using a microcomputer is used in conventional circuit breaker. Although the method of measuring a current value I0 and a phase angle and calculating a leakage current using a microcomputer is chiefly used in a monitoring device or a meter, it takes time until a result is obtained due to the operations performed by the microcomputer, and continuous measurement is not allowed. In addition, the microcomputer requires development of operation software using an analog/digital converter of high precision. This is the same for a power meter which measures an active current or the like, as well as a leakage current meter. The method of obtaining a result by integrating a detected current is proposed to be mainly used in a circuit breaker.

Here, conventional leakage current detection methods are disclosed in, for example, reference documents 1 to 3. The reference document 1 proposes a leakage current detection method and a leakage current detection device, in which a total leakage current is detected from three-phase three-wire power lines, and a capacitive component of the leakage current is canceled and only a resistive component of a leakage current is detected by integrating the detected total leakage current throughout a predetermined phase range. The reference document 2 proposes a leakage current detector for detecting a resistive component leakage current flowing through an AC power line, using two half-wave integrators. The reference document 3 proposes a resistive component leakage current detection circuit which determines a leakage current although a frequency of a measured signal is changed.

Patent document 1: Japanese Patent Publication No. 2011-15583.
Patent document 2: International Patent Publication No. 2009/002120.
Patent document 3: Japanese Patent Publication No. Heisei 8-182180.

However, in the leakage current detection methods described in the reference documents 1 to 3, a vector operation is performed after measuring a current value and phase differences of a voltage waveform and a current waveform which are used as a reference, and a value calculated by the vector operation is multiplied by a coefficient or another measurement result, or an integration is performed on the calculated value, and a result of the multiplication or integration is compared with a threshold value. An integration circuit for performing the integration is required to obtain a result by integrating the detected current value, and since a large deviation occurs by using the integration circuit, the deviation needs to be adjusted. In addition, a plurality of integration circuits is needed to simultaneously or continuously measure various types of current values. Since a value of a total leakage current I0 is not correct if the total leakage current I0 exceeds a measurable range, it is preferable to measure the total leakage current together with a resistive component leakage current Igr.

In addition, in a conventional device or meter, the main stream is a method of measuring a current value I0, a phase angle sin θ and a phase angle cos θ and calculating a leakage current using a microcomputer. In this method, a time for stabilizing an output value is required in order to calculate a leakage current using a microcomputer. Since a time is required until an output value is stabilized, an intermittent leakage current which occurs only for a short period of time cannot be measured, and thus measurement of a good response cannot be expected. Therefore, a product capable of performing measurements with a good response is required.

In addition, in the vector operation processed using a microcomputer, a current value and phase differences of a voltage waveform and a current waveform which are used as a reference are measured, and a vector operation or a multiplication is performed on a result of the measurement, and in addition, since the measurement result cannot be obtained every time-delaying half-wave cycle, the burden on the microcomputer is heavy. In the method of using an integration circuit which integrates the detected current value, the three items cannot be simultaneously output since integration is performed after determining a phase difference, and in addition, when a next measurement is performed, a result of the integration needs to be cleared, and thus two integration circuits need to be prepared in order to perform continuous measurements (every half-wave period).

SUMMARY OF THE INVENTION

Therefore, the present invention has been made in view of the above problems, and it is an object of the present invention to provide a signal generation device and a signal generation method, which can easily and stably detect an input current value I and phase-shifted current values I cos θ and I sin θ at the same time within a short period and automatically output the detected values without calculating a vector of a phase difference.

To accomplish the above object, according to a first embodiment of the present invention, there is provided a signal generation device including a first comparator for receiving a voltage waveform detected from a measured power line and generating a first logical signal according to a positive or negative polarity of the voltage waveform; a second comparator for receiving a current waveform detected from the measured power line and generating a second logical signal according to a positive or negative polarity of the current waveform; a first operation unit for outputting a third logical signal according to exclusive-OR of the first logical signal and the second logical signal; a phase shift unit for generating a phase shift signal by shifting a phase of the first logical signal, after creating a zero cross point by a zero cross creation unit when the first logical signal is changed, memorizing a time between the created zero cross points, and inverting the first logical signal during a period where a time from a next zero cross point is less than the memorized time; a second operation unit for outputting a fourth logical signal according to exclusive-OR of the phase-shifted logical signal and the second logical signal; a full-wave rectifier for performing full-wave rectification on the detected current waveform; and a transform unit for outputting a quantization value, which corresponds to an average value of a current waveform in a certain period of a corresponding current waveform obtained by performing quantization transform on the current waveform that is full-wave rectified by the full-wave rectifier using a successive ΔΣADC, at a ratio of the number of counts of an output of the successive ΔΣADC with respect to the number of CLKs of a reference CLK pulse of the certain period, counted during the certain period based on the reference CLK pulse, in which the third logical signal, the fourth logical signal and the quantization value are output to a measurement unit which outputs an I count value corresponding to current I obtained by counting the quantization value output during a half-wave period from the next zero cross point created by the zero cross detection unit to a next zero cross point, an I cos count value corresponding to current I cos θ obtained by counting the quantization value output during the half-wave cycle in a count method based on the third logical signal, and an I sin count value corresponding to current I sin θ obtained by counting the quantization value output during the half-wave cycle in a count method based on the fourth logical signal.

To accomplish the above object, according to a first embodiment of the present invention, there is provided a signal generation method including the steps of generating a first logical signal according to a positive or negative polarity of a voltage waveform detected from a measured power line; generating a second logical signal according to a positive or negative polarity of a current waveform detected from the measured power line; outputting a third logical signal according to exclusive-OR of the first logical signal and the second logical signal; generating a phase shift signal by shifting a phase of the first logical signal, after creating a zero cross point by a zero cross creation unit when the first logical signal is changed, memorizing a time between the created zero cross points, and inverting the first logical signal during a period where a time from a next zero cross point is less than the memorized time; outputting a fourth logical signal according to exclusive-OR of the phase-shifted logical signal and the second logical signal; performing full-wave rectification on the detected current wave form; and outputting a quantization value, which corresponds to an average value of a current waveform in a certain period of a corresponding current waveform obtained by performing quantization transform on the full-wave rectified current waveform using a successive ΔΣADC, at a ratio to the number of counts of an output of the successive ΔΣADC with respect to the number of CLKs of a reference CLK pulse of the certain period, counted during the certain period based on the reference CLK pulse, in which the third logical signal, the fourth logical signal and the quantization value are output to a measurement unit which outputs an I count value corresponding to current I obtained by counting the quantization value output during a half-wave period from the next zero cross point created by the zero cross detection unit to a next zero cross point, an I cos count value corresponding to current I cos θ obtained by counting the quantization value output during the half-wave cycle in a count method based on the third logical signal, and an I sin count value corresponding to current I sin θ obtained by counting the quantization value output during the half-wave cycle in a count method based on the fourth logical signal.

BRIEF DESCRIPTION OF THE DRAWINGS

FIG. 3(a) is a view showing a voltage waveform input into a signal generation device and parameters converted based on the voltage waveform according to an embodiment of the present invention, and FIG. 3(b) is a view showing a current waveform input into a signal generation device and parameters converted based on the current waveform according to an embodiment of the present invention.

FIG. 4 is a view showing an example of setting parameters generated by a signal generation method according to an embodiment of the present invention.

FIG. 9 is a view showing an example of setting parameters generated by a signal generation method according to an embodiment of the present invention.

DESCRIPTION OF SYMBOLS

Figure 1:
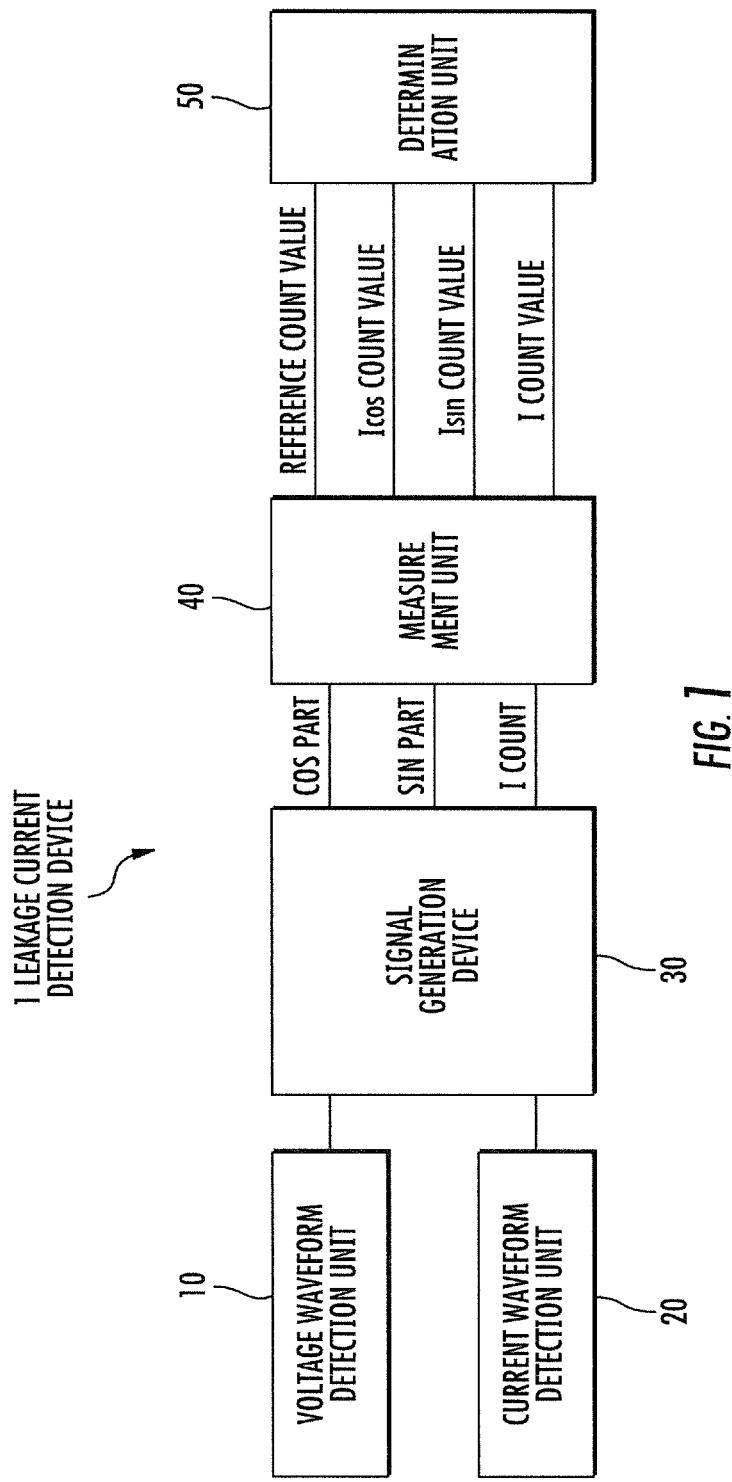
FIG. 1 is a view showing a conceptual configuration of a leakage current detection device according to an embodiment of the present invention.

1: Leakage current detection device
10: Voltage waveform detection unit
20: Current waveform detection unit
30: Signal generation device
33: Parameter output unit
35: Signal generation unit
37: Quantization output unit
40: Measurement unit
50: Determination unit
100: First comparator
200: Second comparator
300: Full-wave rectifier
400: Transform unit
500: Phase shift unit
600: First count value calculation unit
700: Second count value calculation unit
800: Zero cross creation unit

DETAILED DESCRIPTION OF THE PREFERRED EMBODIMENTS

The preferred embodiments of the invention will be hereafter described in detail, with reference to the accompanying drawings. In addition, the present invention is not limited to the embodiments described below.

First, a leakage current detection device according to an embodiment of the present invention will be described in detail with reference to the accompanying drawings.

Figure 2:
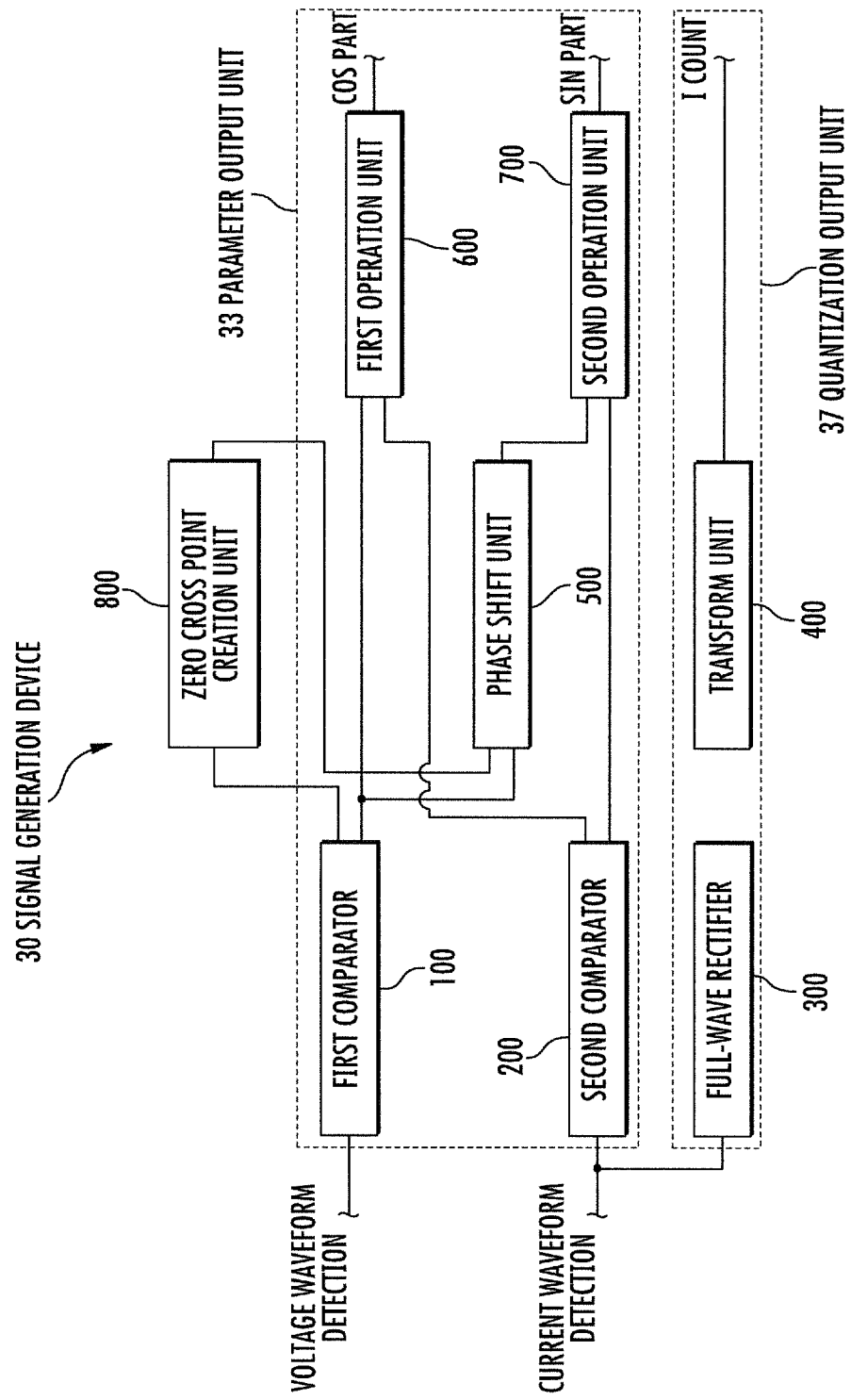
FIG. 2 is a view showing a conceptual configuration of a signal generation device of a leakage current detection device according to an embodiment of the present invention.

FIG. 1 is a view showing a conceptual configuration of a leakage current detection device according to an embodiment of the present invention, and FIG. 2 is a view showing a conceptual configuration of a signal generation device of a leakage current detection device according to an embodiment of the present invention.

As shown in FIG. 1, a leakage current detection device 1 according to an embodiment of the present invention includes a voltage waveform detection unit 10 for detecting a waveform of a voltage applied to a measured power line, a current waveform detection unit 20 for detecting a waveform of a current flowing through the measured power line, a signal generation device 30 for performing a certain process on the voltage waveform detected by the voltage waveform detection unit 10 and the current waveform detected by the current waveform detection unit 20, outputting parameter signals of logical signals of a sin part and a cos part by a parameter output unit 33, performing full-wave rectification on the current waveform detected by the current waveform detection unit 20 by a full-wave rectifier 300 of a quantization output unit 37, and performing quantization transform on the full-wave rectified current waveform by a successive $\Delta\Sigma ADC$ of a transform unit 400, a measurement unit 40 for measuring an average value of the parameters of the logical signals of the sin part and the cos part generated by the signal generation device 30 and an average value of the current waveform obtained by performing the process of the successive $\Delta\Sigma ADC$, and a determination unit 50 for receiving a reference count value, an I cos count value, an I sin count value and an I count value on which a certain process has been performed by the measurement unit 40, performing a certain process on the received values, and performing comparison and determination on the received values.

The voltage waveform detection unit 10 detects a voltage waveform by attenuating a voltage applied to a measured power line using an attenuator. In addition, the voltage waveform detection unit 10 may detect the voltage waveform regardless of whether the measured power line is single-phase or three-phase.

The current waveform detection unit 20 detects magnetism generated by a leakage current component flowing through the measured power line, may include a CT sensor unit (not shown) for generating a current from the detected magnetism, and detects a current waveform from the CT sensor unit.

As shown in FIG. 2, the signal generation device 30 according to an embodiment of the present invention is provided with the parameter output unit 33 and the quantization output unit 37. The parameter output unit 33 includes a first comparator 100 for performing a logical process on the voltage waveform detected by the voltage waveform detection unit 10 and generating a first logical signal, a second comparator 200 for performing a logical process on the current waveform detected by the current waveform detection unit 20 and generating a second logical signal, a first operation unit 600 for performing an operation process on the first logical signal and the second logical signal and outputting a positive/negative or Hi/Lo signal, a zero cross creation unit 800 for creating a zero cross point when the first logical signal generated by the first comparator 100 is changed, a phase shift unit 500 for memorizing a time between the zero cross points created by the zero cross creation unit 800 and performing phase shift of the first logical signal by inverting the first logical signal during a period where a time from a next zero cross point is less than the memorized time, and a second operation unit 700 for performing an operation process on the voltage waveform phase-shifted by the phase shift unit 500 and the second logical signal and outputting a positive/negative or Hi/Lo signal. The quantization output unit 37 includes the full-wave rectifier 300 for performing full-wave rectification on the current waveform detected from the power line, and the transform unit 400 for performing quantization transform on the current waveform full-wave rectified by the full-wave rectifier 300, by the successive $\Delta\Sigma ADC$.

The first comparator 100 performs a logical process on the detected voltage waveform and generates a positive/negative or Hi/Lo waveform. The second comparator 200 performs a logical process on the detected current waveform and generates a positive/negative or Hi/Lo waveform. Here, the signal generation device 30 includes the zero cross creation unit 800 for creating a zero cross point when a positive/negative or Hi/Lo state of the logical signal generated by the first comparator 100 is changed.

The first operation unit 600 performs an operation process on the first logical signal generated by the first comparator and the second logical signal generated by the second comparator and outputs a positive/negative or Hi/Lo signal as the cos part.

The phase shift unit 500 memorizes a time between the zero cross points created by the zero cross creation unit 800 and performs phase shift of the first logical signal by inverting the first logical signal during a period where a time from a next zero cross point is less than the memorized time. Further specifically, the phase shift unit 500 counts and memorizes the total number of reference CLK pulses between the zero cross points, i.e., during the half-wave cycle of the voltage waveform, and performs phase shift on the first logical signal by 90 degrees by inverting the first logical signal when the number of reference CLK pulses counted during the next half-wave cycle is less than a half of the memorized number of counts.

The second operation unit 700 performs an operation process on the first logical signal, i.e., the voltage waveform phase-shifted by the phase shift unit 500, and the second logical signal generated by the second comparator, and outputs a positive/negative or Hi/Lo signal as the sin part.

The transform unit 400 performs full-wave rectification on the detected current waveform using the full-wave rectifier 300 and performs quantization transform on the full-wave rectified current waveform using the successive $\Delta\Sigma ADC$. The transform of the successive $\Delta\Sigma ADC$ is performed by a ratio of the number of CLKs of the reference CLK pulse during a half-wave cycle, which becomes a reference count value, to a result of the number of counts of the successive $\Delta\Sigma ADC$. In addition, the successive $\Delta\Sigma ADC$ performs quantization transform on the measured current value, and an average value of the current waveform is obtained by counting the quantization transform during the half-wave cycle. A current value can be obtained by multiplying the average value of the current waveform by a coefficient (a magnification or an RMS of the CT sensor unit). In addition, a voltage value is separately measured, and a power value can be obtained by multiplying the voltage value by the obtained current value. In addition, a result of the measurement can be obtained every half-wave cycle, and since the result of the measurement is measured as an average value within the half-wave cycle, the effect of canceling high frequencies is excellent, and a stable result can be obtained.

Since a result of the measurement is obtained at a ratio of the input current value I and the phase-shifted current values I cos θ and I sin θ to the reference count value, a correct result can be automatically obtained although the frequency of the input AC current waveform is different (although the frequency is 50 Hz or 60 Hz). Accordingly, since a transition or an adjustment due to the frequency is unnecessary and the signal generation device is robust to variation of frequency, a high precision output and a good response can be obtained, and since the variation of frequency caused by deviation of entities, change of temperature or thermal degradation of an internal frequency generator is automatically corrected, a high precision generator, a reference to be compared or an adjustment process is not needed, and thus a further cheaper and highly precise product can be manufactured.

The measurement unit 40 may obtain an average value of a current value of a desired type by performing count of the quantization output unit 37 as is directed by a parameter set by the parameter setting unit 33 of the signal generation device 30. The current value of a desired type may be an AC current value, and an input current I[A], an active current Ir=I cos θ[A] and a reactive current IL−IC=I sin θ[A] may be obtained through the measurement. As for AC power measurement, an apparent power S=VI[VA], an active power P=VI cos θ[W] and a reactive power Q=VI sin θ[Var] may be obtained by multiplying the measured AC current values by a voltage measurement value, respectively, and as for leakage current measurement, a total leakage current I0[A], a single phase resistive component leakage current Igr(I0r)=I0 cos θ[A], a single phase capacitive component leakage current Igc(I0c)=I0 sin θ[A], and a three phase Δ-connection resistive component leakage current Igr(I0r)=I0 sin θ/cos 30° [A] are obtained.

The determination unit 50 compares the values obtained by the measurement unit 40 with a threshold value set to a ratio of the number of counts of the reference CLK pulse. A device for performing the comparison and determining whether or not two values of the I value and the I sin θ value or the I cos θ value exceed the threshold value may be installed. The device performing the comparison and determination provides a function of performing leakage detection based on the I sin θ value or the I cos θ value, and if the I value exceeds a measurable range, the I sin θ value or the I cos θ value is not correctly detected. Therefore, the device performing the comparison and determination may use the determination of the I value with respect to the threshold value as a means for determining whether or not the I value is within a measurable range, and a circuit breaker determines the I value as an abnormal I0 value regardless of determination of an Igr value and determines a result of the determination as a transition of a range.

Although the count values obtained by the measurement unit are compared with the threshold value set to a ratio of the number of counts of the reference CLK pulse as a detection and determination method, since variation of frequency caused by deviation of entities, change of temperature or thermal degradation of an internal frequency generator is automatically corrected by setting the threshold value to a count value obtained by dividing the number of counts of the reference CLK pulse (by one half, a quarter or the like), a high precision generator, a reference to be compared or an adjustment process is not needed, and thus a further cheaper and highly precise product capable of precisely detecting and determining a leakage current can be manufactured.

As described above, since the signal generation device 30 of a leakage current detection device according to an embodiment of the present invention may measure and determine a leakage current in a speedy way and reduce the size of a circuit by generating logical signals from a voltage waveform and a current waveform of a measured power line through first and second comparators, setting parameters, performing full-wave rectification on the current waveform, performing quantization transform on the full-wave rectified current waveform using a successive $\Delta\Sigma ADC$, obtaining desired measurement values by counting the set parameters and the quantization-transformed quantization value, and detecting current leakage by comparing the measurement values and a reference value, it can be used in a circuit breaker, a current meter or a power meter to measure an input current and phase-shifted active and reactive currents in a speed way, and a cheap and highly precise product can be manufactured.

Next, a method of generating a signal based on a voltage waveform of every half cycle and a current waveform of every half cycle detected from a measured power line, which is executed by the signal generation device 30 of the leakage current detection device 1 according to an embodiment of the present invention described above, will be described with reference to FIGS. 3 to 8.

FIG. 3(a) is a view showing a voltage waveform input into a signal generation device and parameters converted based on the voltage waveform according to an embodiment of the present invention, and FIG. 3(b) is a view showing a current waveform input into a signal generation device and parameters converted based on the current waveform according to an embodiment of the present invention.

It is assumed that ⌈a⌉ is 0° to 90° and 90° to 180° and ⌈b⌉ is 180° to 270° and 270° to 360° as shown in FIGS. 3(a) and (b). In addition, it is assumed that a waveform of the previous half-wave cycle is −180° to −90° and −90° to 0°. In addition, the waveform of the previous half-wave cycle may be memorized in a memory unit (not shown) in advance.

FIG. 3(a) shows an input voltage waveform detected from a measured power line, and Hi/Lo parameters of the V_PN output set by the first comparator 100 and the V__90 output set by the phase shift unit 500 are set based on the input voltage waveform.

FIG. 3(a) shows an input voltage waveform of a sinusoidal wave detected from a measured power line by the voltage waveform detection unit 10, a V_Palse output for creating a zero cross point when a logical signal is changed every half-wave cycle based on the Hi/Lo (+/−) logical signal generated from the input voltage waveform through the first comparator 100, a V_PN output for outputting a Hi/Lo signal every half-wave cycle based on the Hi/Lo logical signal generated from the input voltage waveform through the first comparator 100, and a V__90 output for performing and setting phase shift of the first logical signal by memorizing a time between the zero cross points created by the zero cross creation unit 800 and inverting the first logical signal during a period where a time from a next zero cross point is less than the memorized time.

FIG. 3(b) shows an input current waveform detected from a measured power line by the current waveform detection unit 20, and the Hi/Lo parameters of the I_PN output are set based on the input current waveform.

FIG. 3(b) shows an input current waveform of a sinusoidal wave detected from a measured power line, and an I_PN output for outputting a Hi/Lo signal every half-wave cycle based on the Hi/Lo (+/−) logical signal generated from the input current waveform through the second comparator 200.

FIG. 4 shows logical operations performed on the Hi/Lo parameters of the V_PN output and the V__90 output based on the input voltage waveform shown in FIG. 3(a) and on the Hi/Lo parameters of the I_PN output based on the input current waveform shown in FIG. 3(b) and methods of counting a value desired to obtain. As shown in FIG. 4, an input current, a total leakage current, an active current, a single phase resistive component leakage current, a reactive current, a single phase capacitive component leakage current, and a three phase Δ-connection resistive component leakage current can be easily obtained by setting a Hi/Lo parameter every half-wave cycle and determining a count method (UP or DOWN) using the set parameter.

Next, referring to the method of setting parameters based on the voltage waveform and the current waveform shown in FIGS. 3(a) and (b) and the counting methods shown in FIG. 4, a method of setting parameters when the phase angle of the input current waveform is 0°, 45°, 60° and 90° with respect to the input voltage waveform and a result of obtaining count values of I, I cos θ and I sin θ based on the set parameters will be described with reference to FIGS. 5 to 8. In addition, the parts of FIGS. 5 to 8 overlapped with those of FIGS. 3(a) and (b) and FIG. 4 will not be described.

Figure 5:
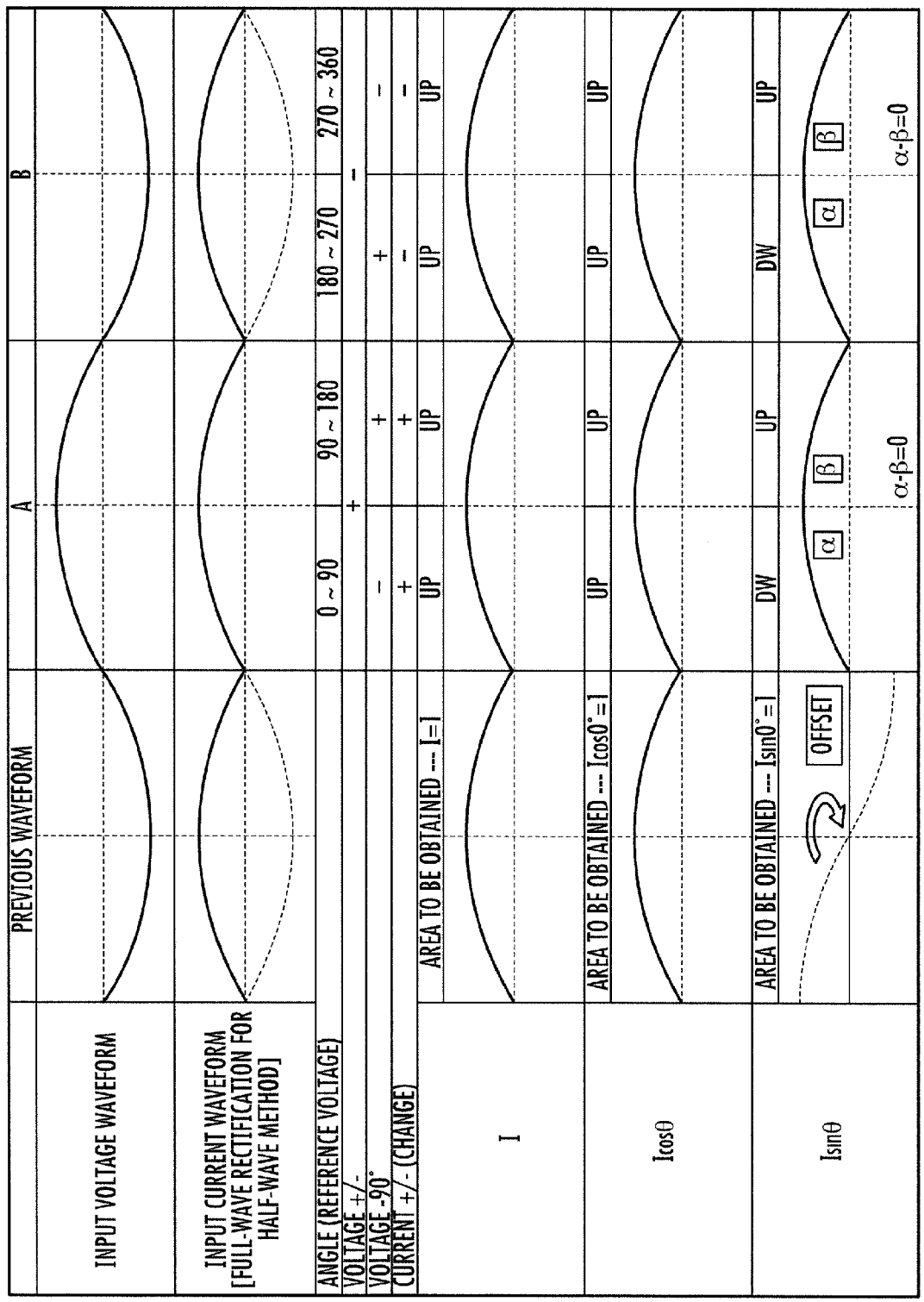
FIG. 5 is a view showing an example of a voltage waveform, a current waveform and a method of setting parameters based on the voltage waveform and the current waveform according to an embodiment of the present invention.

FIG. 5 is a view showing an example of a voltage waveform, a current waveform and a method of setting parameters based on the voltage waveform and the current waveform according to an embodiment of the present invention. The method of setting parameters shown in FIG. 5 shows an input voltage waveform used as a reference, an input current waveform detected from a measured power line and shown as a dotted line, and an input current waveform detected from a measured power line, full-wave rectified and shown as a solid line.

FIG. 5 shows a case where the phase angle of the input current waveform is 0° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 5, I is a full-wave rectified current waveform, and an area of 1 is obtained. Since I cos θ has a phase angle of 0°, an area of 1 is obtained, and since I sin θ has a phase angle of 0°, an area of 0 is obtained.

Figure 6:
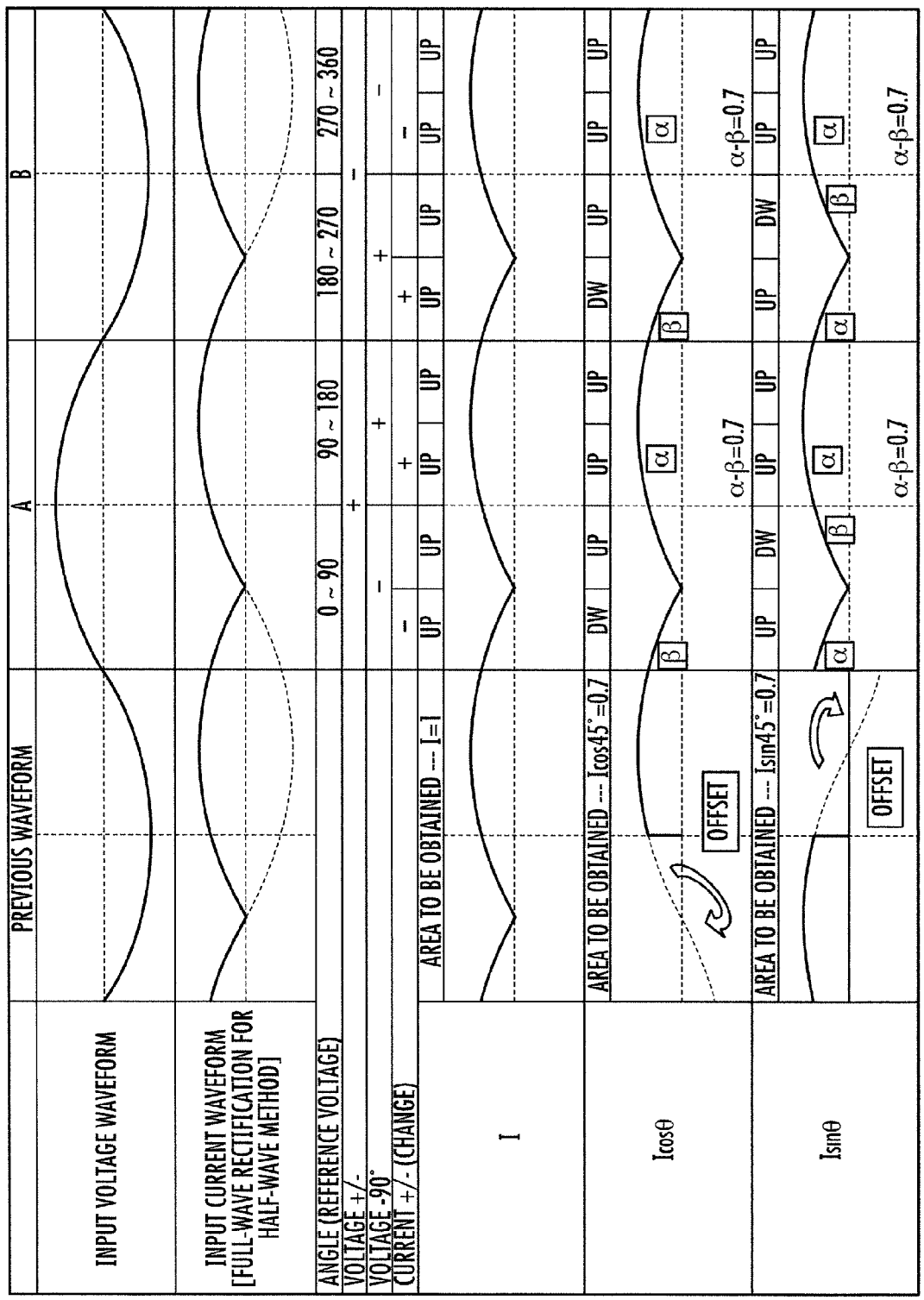
FIG. 6 is a view showing an example of a voltage waveform, a current waveform and a method of setting parameters based on the voltage waveform and the current waveform according to an embodiment of the present invention.

FIG. 6 is a view showing an example of a voltage waveform, a current waveform and a method of setting parameters based on the voltage waveform and the current waveform according to an embodiment of the present invention. The method of setting parameters shown in FIG. 6 shows an input voltage waveform used as a reference, an input current waveform detected from a measured power line and shown as a dotted line, and an input current waveform detected from a measured power line, full-wave rectified and shown as a solid line.

FIG. 6 shows a case where the phase angle of the input current waveform is 45° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 6, I is a full-wave rectified current waveform, and an area of 1 is obtained. Since I cos θ has a phase angle of 45°, an area of 0.7 is obtained, and since I sin θ has a phase angle of 45°, an area of 0.7 is obtained.

Figure 7:
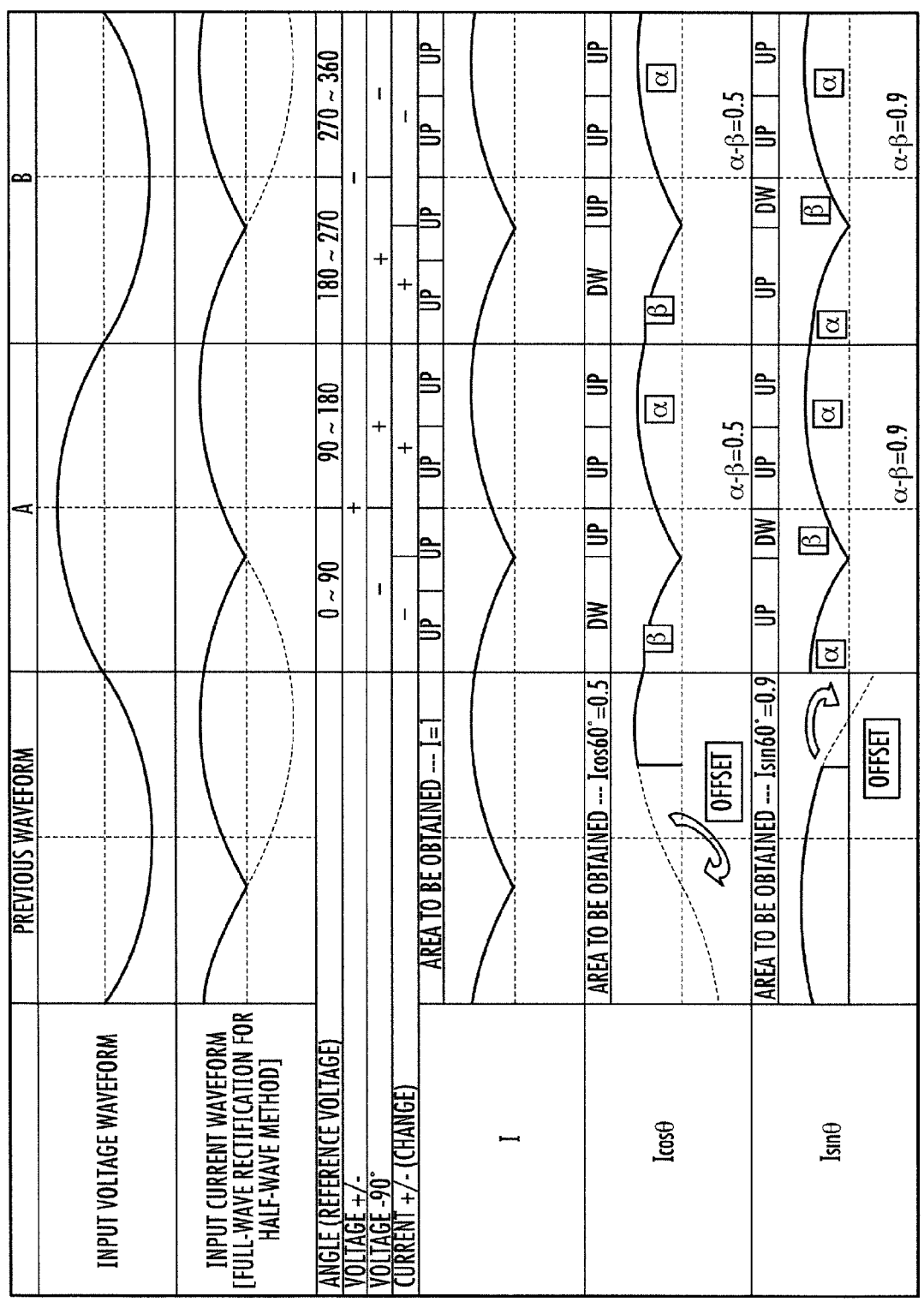
FIG. 7 is a view showing an example of a voltage waveform, a current waveform and a method of setting parameters based on the voltage waveform and the current waveform according to an embodiment of the present invention.

FIG. 7 is a view showing an example of a voltage waveform, a current waveform and a method of setting parameters based on the voltage waveform and the current waveform according to an embodiment of the present invention. The method of setting parameters shown in FIG. 7 shows an input voltage waveform used as a reference, an input current waveform detected from a measured power line and shown as a dotted line, and an input current waveform detected from a measured power line, full-wave rectified and shown as a solid line.

FIG. 7 shows a case where the phase angle of the input current waveform is 60° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 7, I is a full-wave rectified current waveform, and an area of 1 is obtained. Since I cos θ has a phase angle of 60°, an area of 0.5 is obtained, and since I sin θ has a phase angle of 60°, an area of 0.9 is obtained.

Figure 8:
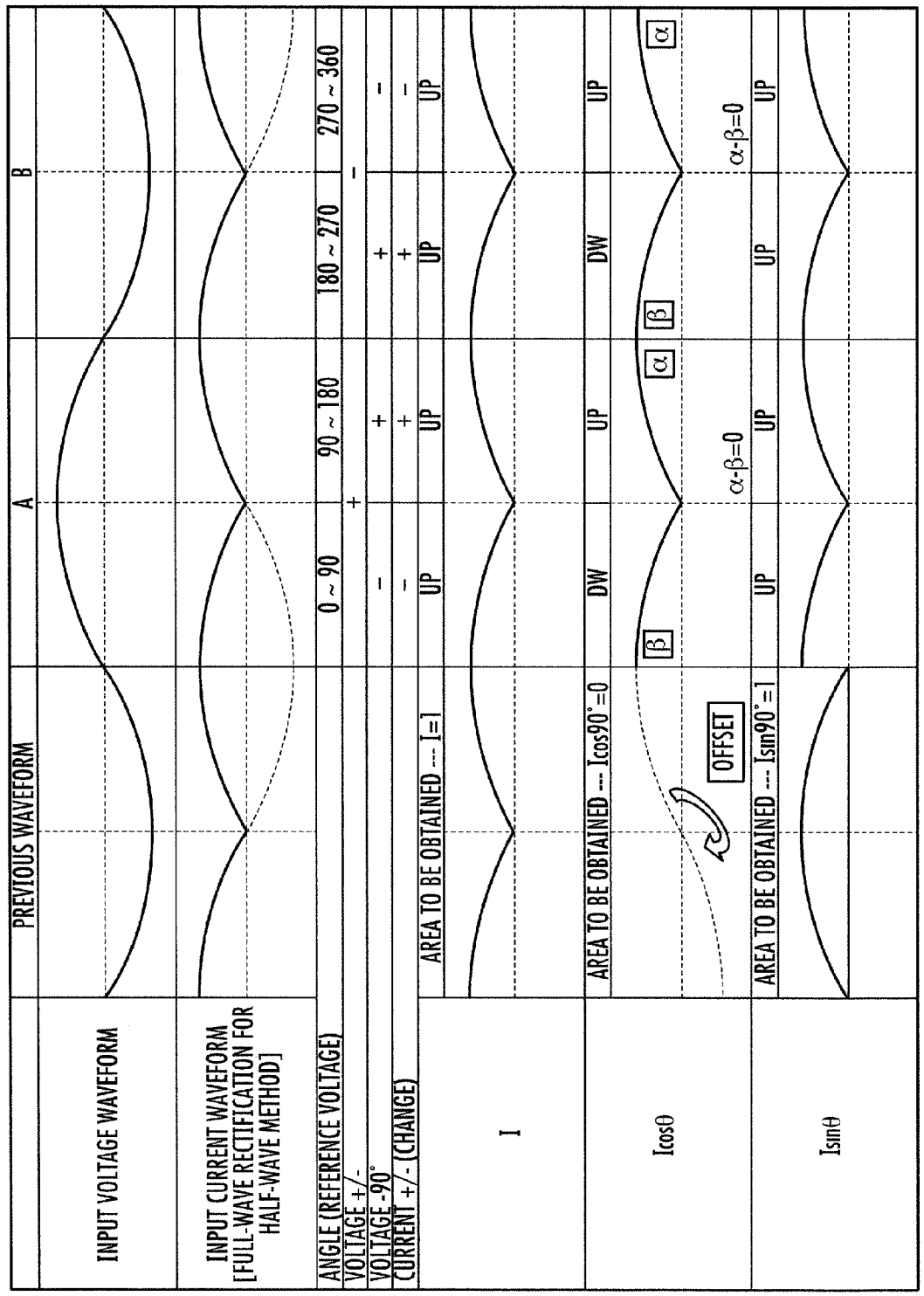
FIG. 8 is a view showing an example of a voltage waveform, a current waveform and a method of setting parameters based on the voltage waveform and the current waveform according to an embodiment of the present invention.

FIG. 8 is a view showing an example of a voltage waveform, a current waveform and a method of setting parameters based on the voltage waveform and the current waveform according to an embodiment of the present invention. The method of setting parameters shown in FIG. 8 shows an input voltage waveform used as a reference, an input current waveform detected from a measured power line and shown as a dotted line, and an input current waveform detected from a measured power line, full-wave rectified and shown as a solid line.

FIG. 8 shows a case where the phase angle of the input current waveform is 90° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 8, I is a full-wave rectified current waveform, and an area of 1 is obtained. Since I cos θ has a phase angle of 90°, an area of 0 is obtained, and since I sin θ has a phase angle of 90°, an area of 1 is obtained.

As described above, since the signal generation method 30 according to an embodiment of the present invention may measure and determine a leakage current in a speedy way and reduce the size of a circuit by generating logical signals every half-wave cycle from a voltage waveform and a current waveform of a measured power line through the first and second comparators, setting parameters, performing full-wave rectification on the current waveform, performing quantization transform on the full-wave rectified current waveform using a successive ΔΣADC, and counting the quantization-transformed quantization value, it can be used in a circuit breaker, a current meter or a power meter to measure an input current and phase-shifted active and reactive currents in a speed way, and a cheap and highly precise product can be manufactured.

Next, a method of generating a signal based on a voltage waveform of every one cycle and a current waveform of every one cycle detected from a measured power line, which is executed by the signal generation device 30 of the leakage current detection device 1 according to an embodiment of the present invention described above, will be described with reference to FIGS. 9 to 13. Here, the method of generating a signal every one cycle aims at improving precision compared with the method of generating a signal every half-wave cycle, by canceling an error which occurs when full-wave rectification transform is performed or a DC component offset applied to the input current waveform.

FIG. 9 shows logical operations performed on the Hi/Lo parameters of the V_PN output and the V_90 output based on the input voltage waveform shown in FIGS. 10 to 13 and on the Hi/Lo parameters of the I_PN output based on the input current waveform shown in FIGS. 10 to 13 and methods of counting a value desired to obtain. As shown in FIG. 9, an input current, a total leakage current, an active current, a single phase resistive component leakage current, a reactive current, a single phase capacitive component leakage current, and a three phase Δ-connection resistive component leakage current can be easily obtained by setting a Hi/Lo parameter every one cycle period and determining a count method (UP or DOWN) using the set parameter.

Next, referring to the method of setting parameters based on the voltage waveform and the current waveform shown in FIGS. 3(a) and (b) and the counting methods shown in FIG. 9, a method of setting parameters when the phase angle of the input current waveform is 0°, 45°, 60° and 90° with respect to the input voltage waveform and a result of obtaining count values of I, I cos θ and I sin θ based on the set parameters will be described with reference to FIGS. 10 to 13. In addition, in FIGS. 10 to 13, a case of setting parameters every one cycle by the input voltage waveform and the input current waveform is described.

Figure 10:
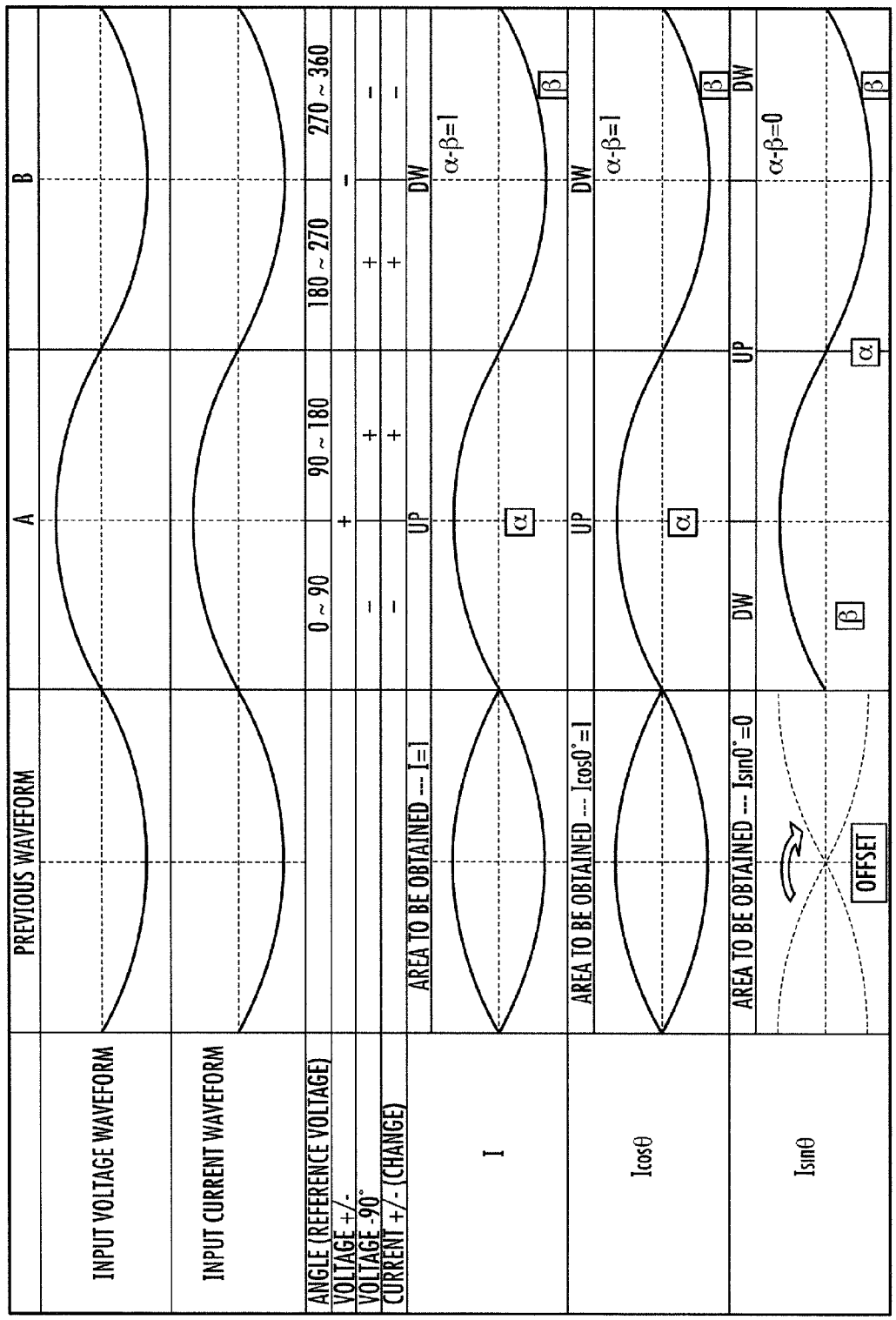
FIG. 10 is a view showing an example of a voltage waveform, a current waveform and a method of setting parameters based on the voltage waveform and the current waveform according to an embodiment of the present invention.

FIG. 10 is a view showing an example of a voltage waveform, a current waveform and a method of setting parameters based on the voltage waveform and the current waveform according to an embodiment of the present invention. The parameter setting method shown in FIG. 10 (<<9) sets parameters based on the input voltage waveform and the input current waveform.

FIG. 10 shows a case where the phase angle of the input current waveform is 0° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 10, I is a current waveform of one cycle, and an area of 1 is obtained. Since I cos θ has a phase angle of 0°, an area of 1 is obtained, and since I sin θ has a phase angle of 0°, an area of 0 is obtained.

Figure 11:
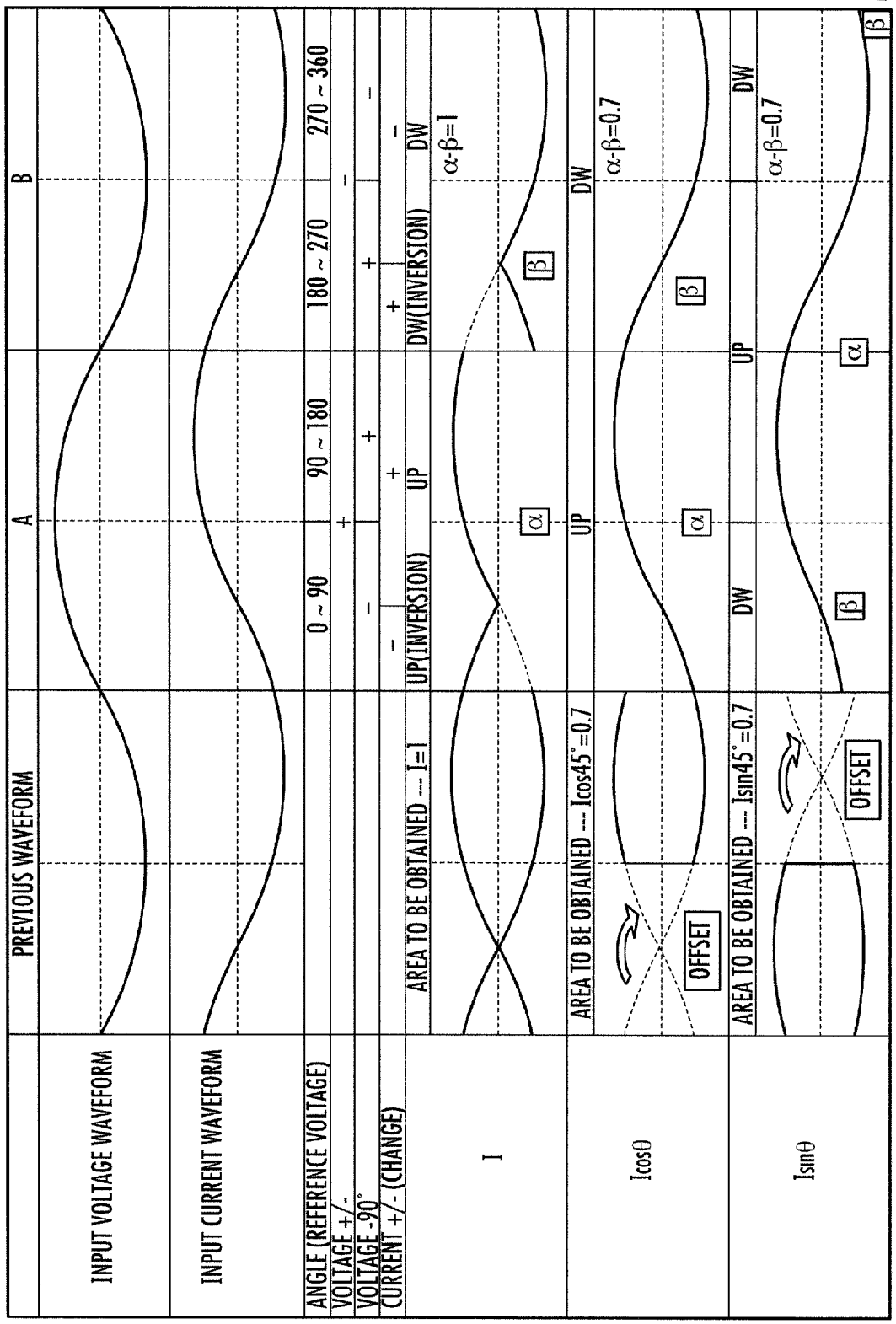
FIG. 11 is a view showing an example of a voltage waveform, a current waveform and a method of setting parameters based on the voltage waveform and the current waveform according to an embodiment of the present invention.

FIG. 11 is a view showing an example of a voltage waveform, a current waveform and a method of setting parameters based on the voltage waveform and the current waveform according to an embodiment of the present invention.

FIG. 11 shows a case where the phase angle of the input current waveform is 45° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 11, I is a current waveform of one cycle, and an area of 1 is obtained. Since I cos θ has a phase angle of 45°, an area of 0.7 is obtained, and since I sin θ has a phase angle of 45°, an area of 0.7 is obtained.

Figure 12:
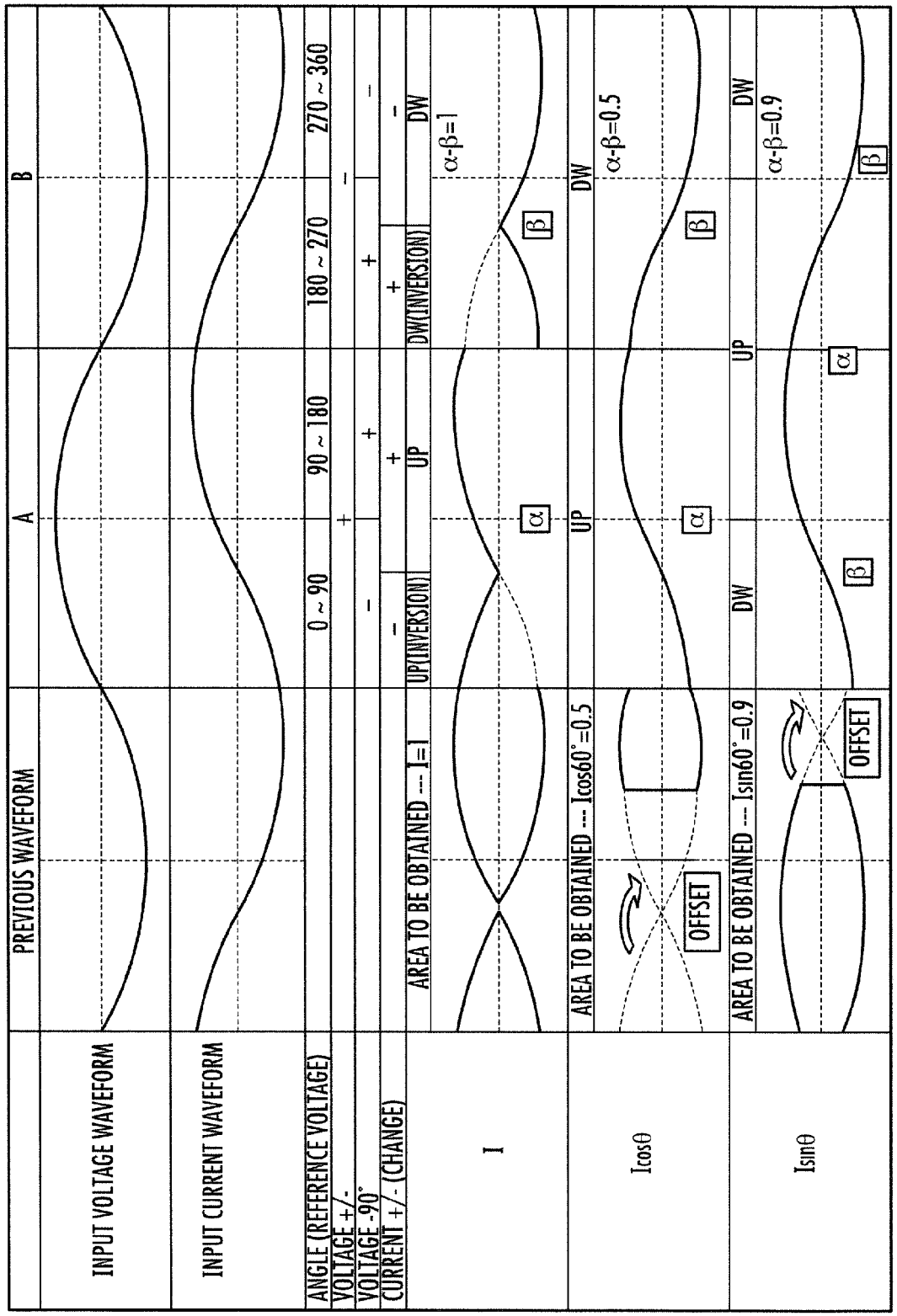
FIG. 12 is a view showing an example of a voltage waveform, a current waveform and a method of setting parameters based on the voltage waveform and the current waveform according to an embodiment of the present invention.

FIG. 12 is a view showing an example of a voltage waveform, a current waveform and a method of setting parameters based on the voltage waveform and the current waveform according to an embodiment of the present invention.

FIG. 12 shows a case where the phase angle of the input current waveform is 60° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 12, I is a current waveform of one cycle, and an area of 1 is obtained. Since I cos θ has a phase angle of 60°, an area of 0.5 is obtained, and since I sin θ has a phase angle of 60°, an area of 0.9 is obtained.

Figure 13:
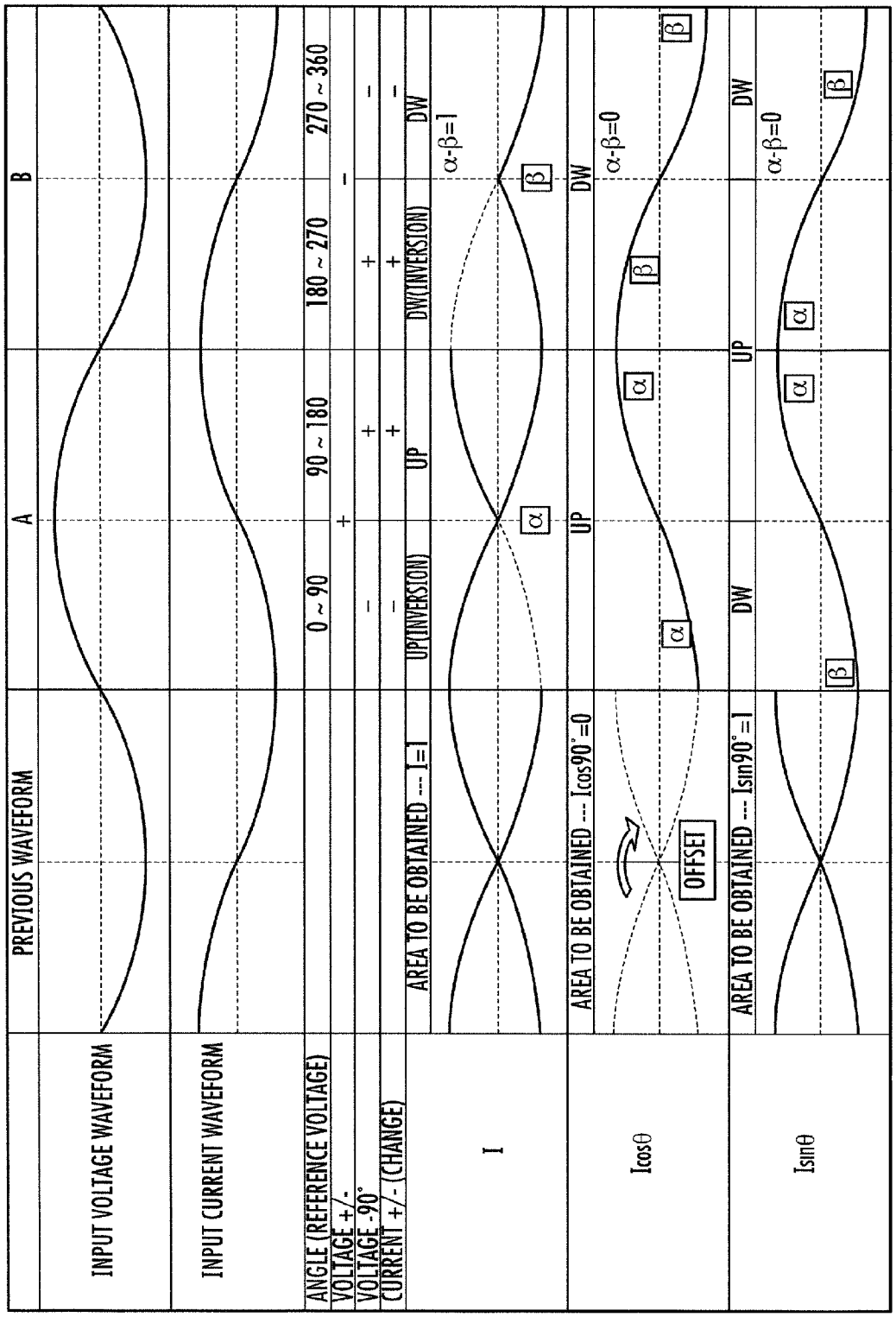
FIG. 13 is a view showing an example of a voltage waveform, a current waveform and a method of setting parameters based on the voltage waveform and the current waveform according to an embodiment of the present invention.

FIG. 13 is a view showing an example of a voltage waveform, a current waveform and a method of setting parameters based on the voltage waveform and the current waveform according to an embodiment of the present invention.

FIG. 13 shows a case where the phase angle of the input current waveform is 90° with respect to the input voltage waveform. In addition, since the method of setting parameters of the input voltage waveform and the input current waveform is described above with reference to FIGS. 3(a) and (b), it will not be described here. A logical operation is performed on the set parameters based on the input voltage waveform and the input current waveform, and I, I cos θ and I sin θ are obtained.

As shown in FIG. 13, I is a current waveform of one cycle, and an area of 1 is obtained. Since I cos θ has a phase angle of 90°, an area of 0 is obtained, and since I sin θ has a phase angle of 90°, an area of 1 is obtained.

As described above, since the signal generation method 30 according to an embodiment of the present invention may measure and determine a leakage current in a speedy way and reduce the size of a circuit by generating logical signals every one cycle from a voltage waveform and a current waveform of a measured power line through the first and second comparators, setting parameters, performing quantization transform on the current waveform using a successive ΔΣADC, and counting the quantization-transformed quantization value, it can be used in a circuit breaker, a current meter or a power meter to measure an input current and phase-shifted active and reactive currents in a speed way, and a cheap and highly precise product can be manufactured.

According to the present invention, since the signal generation device and the signal generation method may simultaneously measure and determine an input current value I and phase-shifted current values I cos θ and I sin θ in a short period of time and reduce the size of a circuit, they can be used in a circuit breaker, a current meter or a power meter to measure an input current and phase-shifted active and reactive currents in a speed way, and a cheap and highly precise product can be manufactured.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

That which is claimed is:

1. A signal generation device comprising:
   a first comparator for receiving a voltage waveform detected from a measured power line and generating a first logical signal according to a positive or negative polarity of the voltage waveform;
   a second comparator for receiving a current waveform detected from the measured power line and generating a second logical signal according to a positive or negative polarity of the current waveform;
   a first operation unit for outputting a third logical signal according to exclusive-OR of the first logical signal and the second logical signal;
   a phase shift unit for generating a phase shift signal by shifting a phase of the first logical signal, after creating a zero cross point by a zero cross creation unit when the first logical signal is changed, memorizing a time between the created zero cross points, and inverting the first logical signal during a period where a time from a next zero cross point is less than the memorized time;
   a second operation unit for outputting a fourth logical signal according to exclusive-OR of the phase-shifted logical signal and the second logical signal;
   a full-wave rectifier for performing full-wave rectification on the detected current wave form; and
   a transform unit for outputting a quantization value, which corresponds to an average value of a current waveform in a certain period of a corresponding current waveform obtained by performing quantization transform on the current waveform that is full-wave rectified by the full-wave rectifier using a successive ΔΣADC, at a ratio of the number of counts of an output of the successive ΔΣADC with respect to the number of CLKs of a reference CLK pulse of the certain period, counted during the certain period based on the reference CLK pulse, wherein
   the third logical signal, the fourth logical signal and the quantization value are output to a measurement unit which outputs an I count value corresponding to current I obtained by counting the quantization value output during a half-wave period from the next zero cross point created by the zero cross detection unit to a next zero cross point, an I cos count value corresponding to current I cos θ obtained by counting the quantization value output during the half-wave cycle in a count method based on the third logical signal, and an I sin count value corresponding to current I sin θ obtained by counting the quantization value output during the half-wave cycle in a count method based on the fourth logical signal.

2. A measurement device comprising the signal generation device and the measurement unit according to claim 1.

3. A leakage current detection device comprising the measurement device according to claim 2 and a determination unit for detecting leakage of the measured power line based on a value output from the measurement unit.

4. A signal generation method comprising the steps of:
   generating a first logical signal according to a positive or negative polarity of a voltage waveform detected from a measured power line;
   generating a second logical signal according to a positive or negative polarity of a current waveform detected from the measured power line;
   outputting a third logical signal according to exclusive-OR of the first logical signal and the second logical signal;
   generating a phase shift signal by shifting a phase of the first logical signal, after creating a zero cross point by a zero cross creation unit when the first logical signal is changed, memorizing a time between the created zero cross points, and inverting the first logical signal during a period where a time from a next zero cross point is less than the memorized time;
   outputting a fourth logical signal according to exclusive-OR of the phase-shifted logical signal and the second logical signal;
   performing full-wave rectification on the detected current wave form; and
   outputting a quantization value, which corresponds to an average value of a current waveform in a certain period of a corresponding current waveform obtained by performing quantization transform on the full-wave rectified current waveform using a successive ΔΣADC, at a ratio to the number of counts of an output of the successive ΔΣADC with respect to the number of CLKs of a reference CLK pulse of the certain period, counted during the certain period based on the reference CLK pulse, wherein the third logical signal, the fourth logical signal and the quantization value are output to a measurement unit which outputs an I count value corresponding to current I obtained by counting the quantization value output during a half-wave period from the next zero cross point created by the zero cross detection unit to a next zero cross point, an I cos count value corresponding to current I cos θ obtained by counting the quantization value output during the half-wave cycle in a count method based on the third logical signal, and an I sin count value corresponding to current I sin θ obtained by counting the quantization value output during the half-wave cycle in a count method based on the fourth logical signal.

* * * * *